(12) United States Patent
Nagata et al.

(10) Patent No.: US 11,527,984 B2
(45) Date of Patent: Dec. 13, 2022

(54) ABNORMALITY DETERMINATION SYSTEM, MOTOR CONTROL APPARATUS, AND ABNORMALITY DETERMINATION APPARATUS

(71) Applicant: KABUSHIKI KAISHA YASKAWA DENKI, Kitakyushu (JP)

(72) Inventors: Takeshi Nagata, Kitakyushu (JP); Takaaki Shogaki, Kitakyushu (JP); Yasufumi Yoshiura, Kitakyushu (JP); Tadashi Okubo, Kitakyushu (JP); Toshinobu Kira, Kitakyushu (JP)

(73) Assignee: KABUSHIKI KAISHA YASKAWA DENKI, Kitakyushu (JP)

( * ) Notice: Subject to any disclaimer, the term of this patent is extended or adjusted under 35 U.S.C. 154(b) by 309 days.

(21) Appl. No.: 16/879,760

(22) Filed: May 21, 2020

(65) Prior Publication Data

US 2020/0287497 A1 Sep. 10, 2020

Related U.S. Application Data

(63) Continuation of application No. PCT/JP2018/026097, filed on Jul. 10, 2018.

(30) Foreign Application Priority Data

Nov. 28, 2017 (JP) .............................. JP2017-228046

(51) Int. Cl.
*H02P 29/024* (2016.01)
*G01R 31/34* (2020.01)
(Continued)

(52) U.S. Cl.
CPC .......... *H02P 29/024* (2013.01); *G01R 31/343* (2013.01); *G05B 23/024* (2013.01); *G06N 3/08* (2013.01); *H02P 6/12* (2013.01)

(58) Field of Classification Search
CPC ... G05B 13/0265; G05B 23/024; H02P 23/14; H02P 27/06; H02P 29/60; H02P 23/0018;
(Continued)

(56) References Cited

U.S. PATENT DOCUMENTS

2003/0201745 A1 10/2003 Hayashi
2017/0242076 A1 8/2017 Yoshiura
(Continued)

FOREIGN PATENT DOCUMENTS

CN 104756399 7/2015
CN 109725625 5/2019
(Continued)

OTHER PUBLICATIONS

International Search Report for corresponding International Application No. PCT/JP2018/026097, dated Sep. 4, 2018.
(Continued)

*Primary Examiner* — Said Bouziane
(74) *Attorney, Agent, or Firm* — Mori & Ward, LLP

(57) ABSTRACT

An abnormality determination system includes a state quantity obtaining circuit and an abnormality determination circuit. The state quantity obtaining circuit is configured to obtain a state quantity associated with a mechanical system. The abnormality determination circuit is configured to, according to a learning content obtained in a machine learning process and based on the state quantity, determine as to at least one of an occurrence of an abnormality in the mechanical system, an occurrence position of the abnormality, and a cause of the abnormality.

18 Claims, 12 Drawing Sheets

(51) Int. Cl.
  *G05B 23/02* (2006.01)
  *G06N 3/08* (2006.01)
  *H02P 6/12* (2006.01)

(58) Field of Classification Search
  CPC ....... H02P 6/12; H02P 29/024; G01R 31/343; G06N 3/08
  See application file for complete search history.

(56) References Cited

U.S. PATENT DOCUMENTS

2019/0052214 A1* 2/2019 Sumita .................... H02P 21/18
2019/0129372 A1 5/2019 Shogaki et al.

FOREIGN PATENT DOCUMENTS

| JP | 2003-316422 | 11/2003 |
|----|-------------|---------|
| JP | 2006-285702 | 10/2006 |
| JP | 2006-309570 | 11/2006 |
| JP | 5827425 B1 | 12/2015 |
| JP | 5827426 B1 | 12/2015 |
| JP | 5847338 B2 | 1/2016 |
| JP | 2017-151598 | 8/2017 |
| WO | WO 2014/112178 | 7/2014 |

OTHER PUBLICATIONS

Japanese Office Action for corresponding JP Application No. 2018-554787, dated Dec. 18, 2018 (w/ English machine translation).
Extended European Search Report for corresponding EP Application No. 18884019.3-1202, dated Aug. 2, 2021.
Hai-Ni et al., "Application of EMD Mahalano-bis Distance and SOM Neural Network in Fault Diagnosis", Noise and Vibration Control, Feb. 2016, vol. 36, No. 1, (English abstract included), See Cite No. 5.
Chinese Office Action for corresponding CN Application No. 201880063974.0, dated Aug. 25, 2022 (w/ English machine translation).

* cited by examiner

ABNORMALITY DETERMINATION SYSTEM, MOTOR CONTROL APPARATUS, AND ABNORMALITY DETERMINATION APPARATUS

CROSS-REFERENCE TO RELATED APPLICATIONS

The present application is a continuation application of International Application No. PCT/JP2018/026097, filed Jul. 10, 2018, which claims priority to Japanese Patent Application No. 2017-228046, filed Nov. 28, 2017. The contents of these applications are incorporated herein by reference in their entirety.

BACKGROUND

Field of the Invention

The embodiments disclosed herein relate to an abnormality determination system, a motor control apparatus, and an abnormality determination apparatus.

Discussion of the Background

JP 58274251B and JP 5827426B disclose a technique of performing foretaste diagnosis of a state of mechanical equipment by analyzing sensor data based on a statistical method.

SUMMARY

According to one aspect of the present disclosure, an abnormality determination system includes a state quantity obtaining circuit and an abnormality determination circuit. The state quantity obtaining circuit is configured to obtain a state quantity associated with a mechanical system. The abnormality determination circuit is configured to, according to a learning content obtained in a machine learning process and based on the state quantity, determine as to at least one of an occurrence of an abnormality in the mechanical system, an occurrence position of the abnormality, and a cause of the abnormality.

According to another aspect of the present disclosure, a motor control apparatus includes a circuit, a state quantity obtaining circuit, and an abnormality determination circuit. The circuit is configured to supply electric power to a motor to drive a motor-driven mechanism. The state quantity obtaining circuit is configured to obtain a state quantity associated with at least one of the motor, the motor-driven mechanism, and the motor control apparatus. The abnormality determination circuit is configured to, according to a learning content obtained in a machine learning process and based on the state quantity, determine whether at least one of the motor, the motor-driven mechanism, and the motor control apparatus has an abnormality.

According to the other aspect of the present disclosure, an abnormality determination apparatus includes a state quantity obtaining circuit and an abnormality determination circuit. The state quantity obtaining circuit is configured to obtain a state quantity associated with a mechanical system. The abnormality determination circuit is configured to, according to a learning content obtained in a machine learning process and based on the state quantity, determine as to at least one of an occurrence of an abnormality in the mechanical system, an occurrence position of the abnormality, and a cause of the abnormality.

BRIEF DESCRIPTION OF THE DRAWINGS

A more complete appreciation of the present disclosure and many of the attendant advantages thereof will be readily obtained as the same becomes better understood by reference to the following detailed description when considered in connection with the accompanying drawings, wherein.

DESCRIPTION OF THE EMBODIMENTS

Figure 1:
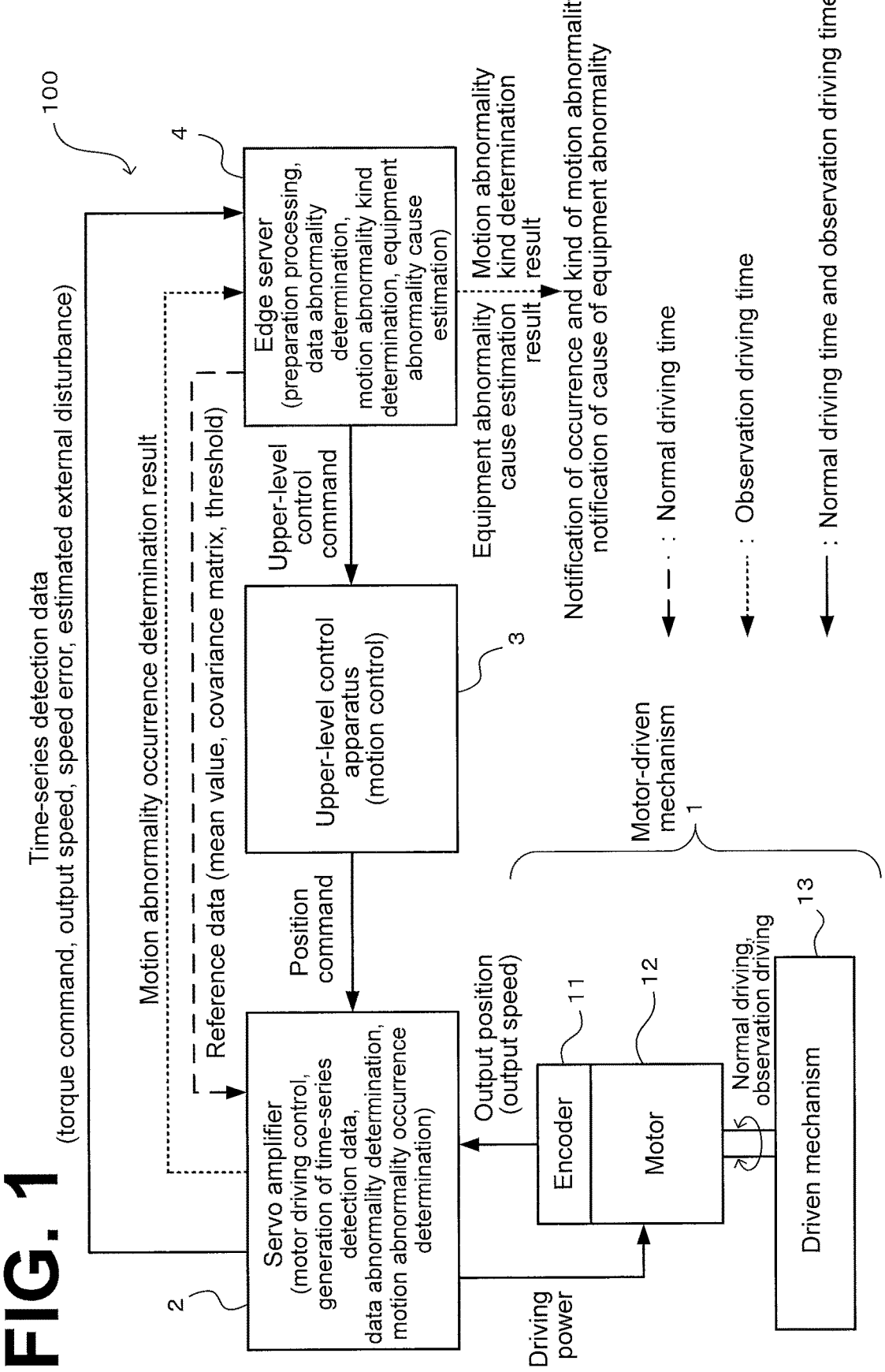
FIG. 1 illustrates a schematic block configuration of an abnormality determination system.

The embodiments will now be described with reference to the accompanying drawings, wherein like reference numerals designate corresponding or identical elements throughout the various drawings.

1: General Arrangement of Abnormality Determination System

By referring to FIG. 1, an example general arrangement of an abnormality determination system according to this embodiment will be described.

FIG. 1 illustrates a schematic block configuration of the abnormality determination system. As illustrated in FIG. 1, an abnormality determination system 100 includes a motor-driven mechanism 1, a servo amplifier 2, an upper-level control apparatus 3, and an edge server 4.

The motor-driven mechanism 1 is a mechanical system whose driving is controlled by the abnormality determination system 100 and is a target of determination as to various kinds of abnormality associated with the driving. The motor-driven mechanism 1 includes: a motor 12, which includes an encoder 11; and a driven machine 13, which is driven by the motor 12. In this embodiment, the motor 12 is a rotary electric motor; the encoder 11 is a sensor that optically detects and outputs a rotational angle of the motor; and the driven mechanism 13 is a timing belt mechanism (not illustrated) that rotates a timing belt.

The servo amplifier 2 (motor control apparatus) has a function (motor driving control function) of feeding driving power to the motor 12 to control driving of the motor 12 so that the output position of the motor 12 follows a position command input from the upper-level control apparatus 3, described later. Also in this embodiment, the servo amplifier 2 also has a function of successively obtaining four pieces of data as time-series detection data (see FIG. 2, described later) and outputting the four pieces of data to the edge server 4, described later. The four pieces of data are: a torque command generated in the process of feeding driving power; output speed generated based on the output position of the motor 12 output from the encoder 11; estimated external disturbance; and speed error. Also in this embodiment, the servo amplifier 2 also has a function of making a data abnormality determination based on the above-described time-series detection data and making an equipment abnormality occurrence determination based on how the data abnormality determination was made (this will be described in detail later).

The upper-level control apparatus 3 has a function (motion control function) of, based on an upper-level control command, described later, input from the edge server, successively outputting a position command to the motor 12 to cause the driven machine 13 to make a desired, time-dependent driving motion.

The edge server 4 (abnormality determination apparatus) is implemented by, for example, a general-purpose personal computer, and has a function of outputting an upper-level control command to the upper-level control apparatus 3 so as to cause the driven machine 13 to make a desired, time-dependent driving motion. It is to be noted that the upper-level control command may be output to the upper-level control apparatus 3 through another PLC (Programmable Logic Controller), not illustrated. Also in this embodiment, the edge server 4 also has: a function of performing preparation processing before normal operation of the abnormality determination system 100 (that is, during normal driving, described later); and a function of making an equipment abnormality cause estimation in the motor-driven mechanism 1 during the normal operation (that is, at observation driving time, described later). As the preparation processing, the edge server 4 performs the following processing based on the time-series detection data input from the servo amplifier 2 during normal driving, described later. The processing includes: calculating sample mean, sample covariance matrix, and data abnormality determination threshold, which are necessary when the servo amplifier 2 and the edge server 4 make the data abnormality determination; and outputting the sample mean, the sample covariance matrix, and the data abnormality determination threshold to the servo amplifier 2 (see FIG. 5, described later). Also in this embodiment, the edge server 4 also has a function of: storing the time-series detection data input from the servo amplifier 2; and, at the observation driving time, described later, making a data abnormality determination based on the time-series detection data and making a motion abnormality kind determination and an equipment abnormality cause estimation based on how the data abnormality determination was made.

2: Control Block of Servo Amplifier

Figure 2:
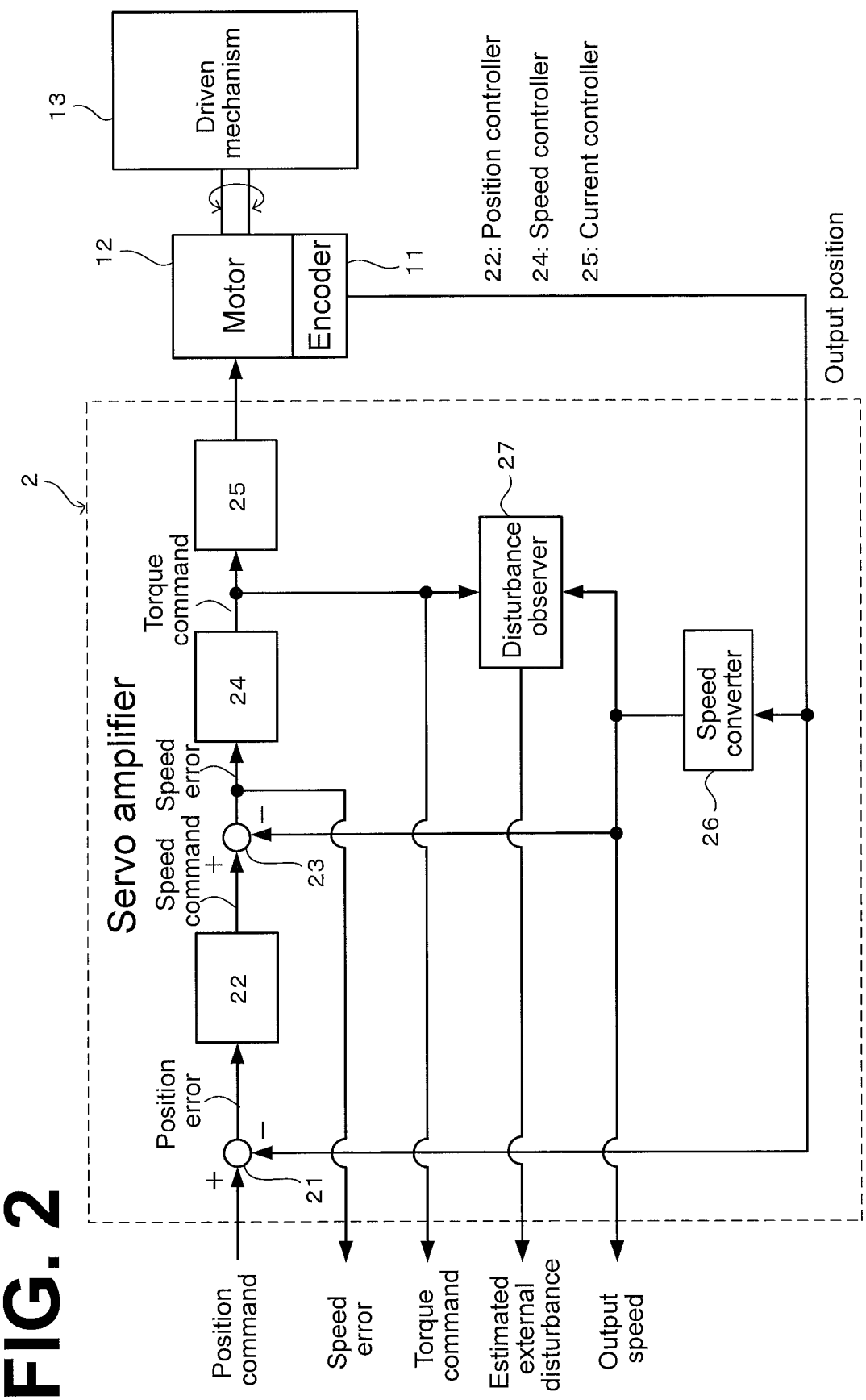
FIG. 2 is a schematic illustrating, in transfer function form, a control block of a servo amplifier that obtains torque command, output speed, estimated external disturbance, and output speed as time-series detection data.

FIG. 2 is a schematic illustrating, in transfer function form, a control block of the servo amplifier 2 according to this embodiment. It is to be noted that in this embodiment, the control block illustrated in FIG. 2 is implemented in the form of software executed by CPU (not illustrated) of the servo amplifier 2.

Referring to FIG. 2, the servo amplifier 2 includes a subtractor 21, a position controller 22, a subtractor 23, a speed controller 24, a current controller 25, a speed converter 26, and a disturbance observer 27. The subtractor 21 subtracts an output position (feedback position), described later, from a position command input from the upper-level control apparatus 3, and outputs a position error. The position controller 22 performs "PID control" and other control based on the position error, and outputs a speed command. The subtractor 23 subtracts an output speed (feedback speed), described later, from the speed command, and outputs a speed error. The speed controller 24 performs "PID control" and other control based on the speed error, and outputs a torque command. The current controller 25 performs power conversion based on the torque command, and outputs and feeds driving power to the motor 12. Then, the encoder 11 detects the output position of the motor 12 as of the time when the motor 12 drives the driven machine 13. Then, the encoder 11 feeds back the output position to the servo amplifier 2. The output position is subtracted from the position command at the subtractor 21 and input into the speed converter 26. The speed converter 26 outputs, based on the output position, an output speed, which is driving speed of the motor 12. It is to be noted that the speed converter 26 may be implemented by, for example, a differentiator that time-differentiates the output position. Based on the torque command and the output speed, the disturbance observer 27 estimates and outputs an external disturbance added to the motor 12.

The subtractor 21, the position controller 22, the subtractor 23, the speed controller 24, the current controller 25, and the speed converter 26, which have been described above, constitute a double feedback loop made up of a "position control feedback loop" and a "speed control feedback loop", together with the external motor 12 and the external encoder 11. It is to be noted that while the current controller 25 also has a current control feedback loop inside the current controller 25, this loop is not illustrated. In these feedback loops, the output of the position error at the subtractor 21 is equivalent to time-differentiate processing of the position command, and the output of the speed error at the subtractor 23 is equivalent to time-differentiate processing of the speed command. Therefore, the double feedback loop of the servo amplifier 2 can be regarded as feedback control performed based on the following motion equation:

$$F = kx + \mu \dot{x} + m\ddot{x}$$

(k: spring coefficient, μ: friction coefficient, m: inertia moment of movable part).

Then, in this embodiment, the servo amplifier 2 successively detects, as the time-series detection data, the torque command, the output speed, the estimated external disturbance, and the speed error at short intervals, such as at every system cycle, and outputs the time-series detection data to the edge server 4.

3: Features of this Embodiment

3-1: Determinations Made in this Embodiment

In recent years, preventative maintenance has been becoming a major keyword amid attempts to improve value added to mechanical systems. Conventional practice was to use a sensor such as a lifetime monitor and an installment environment monitor to give the upper-level control apparatus 3 information contributory to preventative maintenance. Apart from this practice, however, there is a need for making a determination as to whether the motor-driven mechanism 1 has an equipment abnormality and as to content of the equipment abnormality. In light of this need, the abnormality determination system 100 according to this embodiment makes a determination as to content of an equipment abnormality occurring in the motor-driven mechanism 1.

The only abnormal state determinable by the servo amplifier 2 is an abnormal state of the motor 12. In order to determine an abnormal state of the motor 12, conventional practice was to: use machine learning based on a statistical method to determine a data abnormality in the above-described time-series detection data. Based on how the data abnormality was made, a motion abnormality in the motor 12 could be determined.

In contrast, in this embodiment, the edge server 4 obtains a state quantity associated with the mechanical system, which includes the motor-driven mechanism 1, the motor 12, and the servo amplifier 2. Then, using a learning content obtained in a machine learning process and based on the state quantity, the edge server 4 determines at least one of: whether the mechanical system has an abnormality; an occurrence position fan example of "an occurrence location" where the abnormality occurs); and a cause of the abnormality. For example, content of an equipment abnormality in the motor-driven mechanism 1 is correlated with determination content of a data abnormality in the above-described time-series detection data, which is a state quantity of the motor-driven mechanism 1. In this embodiment, therefore, content of an equipment abnormality in the motor-driven mechanism 1 can be determined. As a result, a specific content of an equipment abnormality in a mechanical system can be determined. Methods of determination as to data abnormality, motion abnormality, and equipment abnormality will be described below in turn.

3-2: Definitions of Data Abnormality, Motion Abnormality, and Equipment Abnormality The terms data abnormality, motion abnormality, and equipment abnormality, as used in this embodiment, will be described. The following description of this embodiment employs an example in which the driven mechanism 13 is a timing belt mechanism (not illustrated) that rotates a timing belt, as described above. Example abnormalities occurrable during driving control of the timing belt mechanism include:
1: Abnormality caused by aging degradation of the mechanism as a whole.
2: Abnormality in the timing belt mechanism:
   2a: Loosening of the belt (oscillation);
   2b: Degradation of the belt (increase in friction);
   2c: Grease deficiency on the bearing (increase in friction);
   2d: Contamination of foreign matter (momentary increase in friction); and
   2e: Skipping (momentary increase in friction).

In the above-described abnormalities, loosening of the belt, degradation of the belt, grease deficiency on the bearing, contamination of foreign matter, and skipping will be regarded as mechanical abnormalities in the timing belt mechanism (the motor-driven mechanism 1). In this embodiment, these abnormalities will be referred to as equipment abnormalities. It will be assumed that these equipment abnormalities include mechanical and/or circuit-related abnormalities in the motor 12 itself, which drives the motor-driven mechanism 1, and in the motor control apparatus that controls driving of the motor 12 (referring to FIG. 1, the motor control apparatus includes the encoder 11, the servo amplifier 2, the upper-level control apparatus 3, and other peripheral devices associated with motor control). For example, there are such abnormalities as: degradation of a smoothing capacitor, a power element, and another component included in the servo amplifier 2 (electronic component lifetime degradation); degradation of a dynamic brake circuit (contact point lifetime degradation of a relay used); insulation degradation of a motor coil; and wear degradation of a motor brake. These abnormalities will be regarded as equipment abnormalities. It is to be noted that in the following description, equipment abnormalities in the motor-driven mechanism 1 alone will be described for ease of description. It is also to be noted that the abnormalities associated with motions of the motor 12 are such phenomena as: oscillations that are caused by an equipment abnormality in the motor-driven mechanism 1 and that are occurrable while the motor 12 is making a control motion; an increase in friction; and a momentary increase in friction. In this embodiment, these abnormalities will be referred to as motion abnormalities (and kinds of the motion abnormalities). It is also to be noted that the term data abnormality is intended to mean an abnormality in the time-series detection data used to make a determination as to a motion abnormality in the motor 12 and as to the kind of the motion abnormality. Determinations as to these abnormalities will be described below in turn.

4: Data Abnormality Determination

4-1: Data Abnormality Determination by Machine Learning

Generally, determinations as to normality or abnormality based on observation of waveforms by human being are due largely to experience. Machine learning is a method that involves expressing this experience as mathematical formulae and performing calculations using a calculator. A basic concept of a change detection method by machine learning is to: prepare a normal distribution of a data group that serves as a reference (this data group will be hereinafter referred to as reference data); and check whether data obtained on the operation stage (this data will be hereinafter referred to as observation data) is deviated from the normal distribution.

When a data abnormality determination is made, there is a possible case where all of reference data is assumed to be normal from a data point of view; and there is also a possible case where reference data labeled as normal from a data point of view and reference data labeled as abnormal from a data point of view are mixed. When, however, a data abnormality determination is applied to aging degradation of a mechanism component, it is difficult to prepare abnormal reference data in advance; therefore, more realistic practice would be to assume that all of reference data is normal.

In order to determine whether observation data is deviated from a normal distribution, it is possible to: set a threshold for data abnormality determination purposes at an end of the normal distribution; and check whether the observation data is away from the data abnormality determination threshold relative to the normal distribution center.

4-2: Time-Series Detection Data

In this embodiment, when a plurality of kinds of reference data and/or observation data are obtained, these pieces of data are obtained in the form of the following time-series detection data D, which is defined in the form of an array.

$$D=\{(x^{(1)},y^{(1)}),(x^{(2)},y^{(2)}), \ldots, (x^{(n)},y^{(n)})\}$$

For example, assume a case of a motor-driven mechanism 1 (which is assumed to be a timing belt mechanism, not illustrated) that uses two motors 12 to drive a single driven machine 13. In this case, when torque command and output speed are obtained in the form of time-series detection data for each of the motors 12 (that is, degree of freedom M=number of variable kinds=2), the time-series detection data D is expressed as follows, with subscripts on D denoting time:

$$D_0=\{(0,0),(0,0)\}$$

$$D_{0.001}=\{(1,10),(1.2,9)\}$$

$$D_{0.002}=\{(3,50),(2.8,48)\}$$

4-3: Hotelling's $T^2$ Method

In this embodiment, a Hotelling's $T^2$ method is employed as a change detection method by machine learning. Hotelling's $T^2$ method is a method of multivariate analysis by which changing waveforms of a plurality of kinds of data are observed in parallel to each other. Processing in this method is performed according to the following (Step 1) to (Step 6).

(Step 1) Determine False Alarm Rate

Data includes normal data and abnormal data, and an indicator of how largely abnormal data is deviated from a normal distribution is false alarm rate $\alpha$. For example, when the false alarm rate is considered to be 1%, $\alpha=0.01$. It is to be noted that in a theory of probability and statistics, when the false alarm rate is 0, all of data is normal; therefore, the false alarm rate $\alpha$ is not set at 0 in principle.

(Step 2) Calculate Chi-Squared Distribution

Chi-squared distribution is calculated by solving the equation shown below, with the degree of freedom being M and scale factor s=1. It is to be noted that the degree of freedom M is a parameter that specifies the number of kinds of independent reference data (in the above-described multivariate analysis, the number of variable kinds).

$$\chi^2(x|M,1) = \frac{1}{2\Gamma\left(\frac{M}{2}\right)}\left(\frac{x}{2}\right)^{\frac{M}{2}-1}e^{-\frac{x}{2}}$$

In this equation, $\Gamma$ denotes a gamma function, which is defined by the following equation:

$$\Gamma\left(\frac{M}{2}\right) = \int_0^\infty dt\, t^{\frac{M}{2}-1}e^{-t}$$

(Step 3) Calculate Data Abnormality Determination Threshold

Data abnormality determination threshold $a_{th}$ that satisfies the following equation is calculated based on the false alarm rate $\alpha$ determined at (Step 1) and the chi-squared distribution calculated at (Step 2).

$$1-\alpha=\int_0^{a_{th}}dx\,\chi^2(x|M,1)$$

(Step 4) Calculate Sample Mean and Sample Covariance Matrix

Using the reference data, which is normal data, sample mean μ (the hat operator is omitted in the text, which also applies in the following description) and sample covariance matrix Σ (the hat operator is omitted in the text, which also applies in the following description) are calculated by solving the following equations.

$$\hat{\mu} = \frac{1}{N}\sum_{n=1}^{N} x^{(n)}$$

$$\hat{\Sigma} = \frac{1}{N}\sum_{n=1}^{N}(x^{(n)}-\hat{\mu})(x^{(n)}-\hat{\mu})^T$$

In the equations, $x^{(n)}$ denotes n-th kind reference data.

(Step 5) Calculate Mahalanobis Distance

Based on the sample mean μ and the sample covariance matrix Σ calculated at (Step 4) and based on observation data that has been detected, Mahalanobis distance a(x') is calculated by solving the following equation:

$$a(x')=(x'-\hat{\mu})^T\hat{\Sigma}^{-1}(x'-\hat{\mu})$$

(Step 6) Compare Data Abnormality Determination Threshold and Mahalanobis Distance The data abnormality determination threshold $a_{th}$ calculated at (Step 3) and the Mahalanobis distance a(x') calculated at (Step 5) are compared with each other. When the Mahalanobis distance a(x') is in excess of the data abnormality determination threshold $a_{th}$ (a(x')>$a_{th}$), a determination is made that the observation data used at (Step 5) is in a state of data abnormality.

Figure 3:
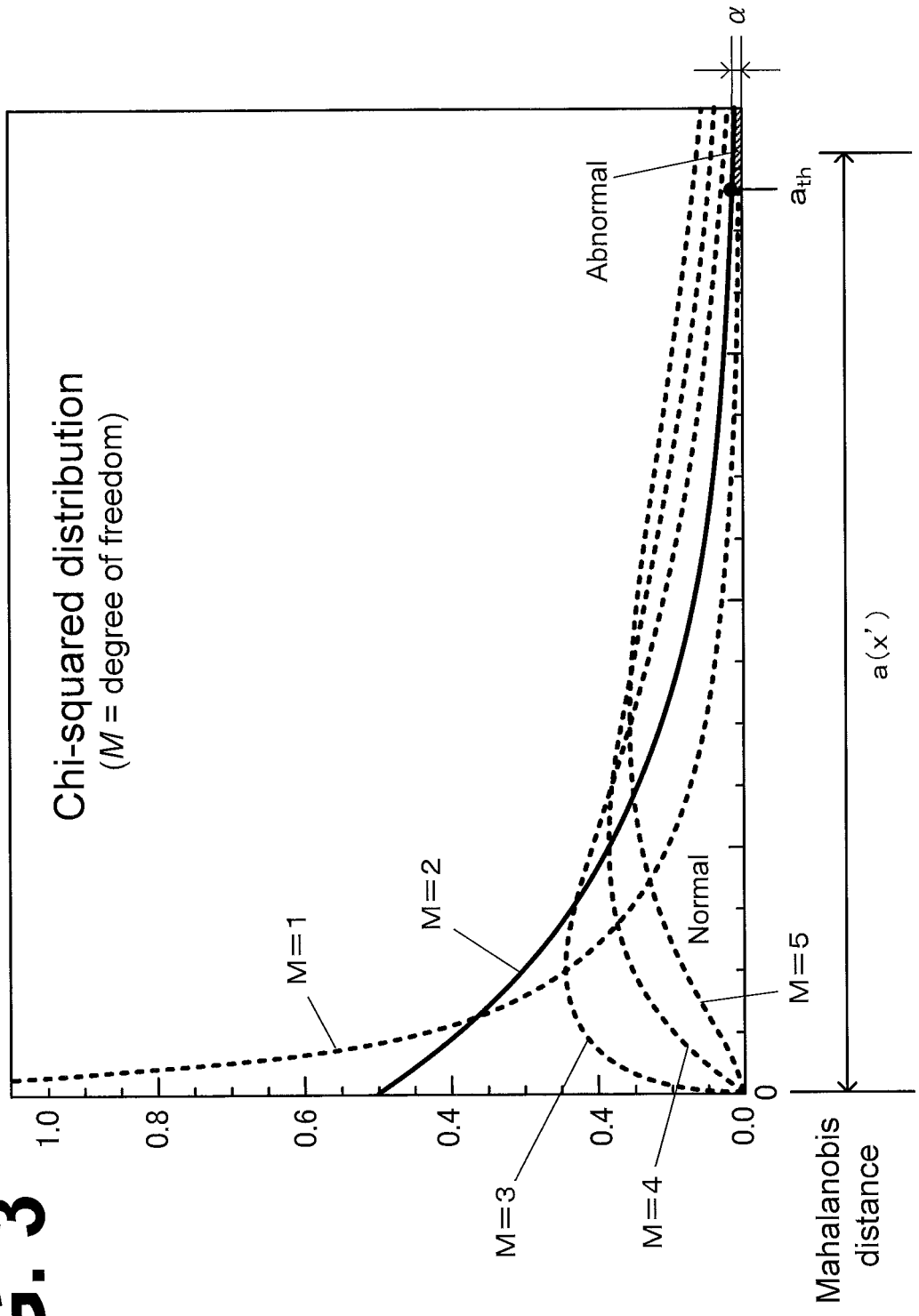
FIG. 3 is a graph illustrating a relationship between chi-squared distribution, data abnormality determination threshold, and Mahalanobis distance.

As illustrated in FIG. 3, chi-squared distribution is a probability distribution that varies in distribution depending on the degree of freedom M. For its "regenerative" nature, chi-squared distribution is suitable for use in multivariate analysis. For example, when the above-described time-series detection data having two kinds of variables (torque command and output speed) is obtained, the degree of freedom M=2, and the chi-squared distribution indicated by the solid line in FIG. 3 is used. In this chi-squared distribution, when the Mahalanobis distance a(x') is greater than the data abnormality determination threshold $a_{th}$, which corresponds to the false alarm rate α, it can be assumed that a data abnormality is occurring in the observation data used to calculate the Mahalanobis distance a(x'). That is, in multivariate analysis where the number of variable kinds is two, a pluralistic degree of abnormality shown using a combination of the two pieces of data (that is, a degree of how far data is away from normal state) can be determined by a unitary comparison between the data abnormality determination threshold $a_{th}$ and the Mahalanobis distance a(x'). It is to be noted that by using the sample mean μ and the sample covariance matrix Σ in the calculation of the Mahalanobis distance a(x'), the influence of the correlation between the normal distributions of the two kinds of data is canceled. It is also to be noted that a data abnormality determination may be made individually for each kind of data by the Hotelling's $T^2$ method, with the degree of freedom=1.

4-4: Specific Data Abnormality Determination

First, a method for making a determination as to data abnormality without using machine learning will be described as a comparative example.
(Preparation)
1: A plurality of pieces of normal data are obtained as reference data.
2: Normal distributions respectively corresponding to different points of time are prepared based on the reference data group.
3: Data abnormality determination thresholds are set for the normal distributions respectively corresponding to the different points of time.
(Data Abnormality Determination)
1: Observation data is obtained.
2: Add the observation data to the normal distribution corresponding to the time at which the observation data was obtained.
3: When the observation data is in excess of the data abnormality determination threshold set for the normal distribution, the observation data is determined as abnormal.

In the method used in the comparative example, it is necessary to prepare a normal distribution and a data abnormality determination threshold for each point of time, and it is also necessary to calculate a normal distribution on the part of the observation data. In order to calculate a normal distribution, it is necessary to calculate an average value and a standard deviation. Since, however, calculating a standard deviation involves a complicated process, it is not realistic to perform the calculation on an individual time point basis. Additionally, since it is necessary to set a data abnormality determination threshold for the normal distribution corresponding to each point of time, the data abnormality determination threshold varies from time point to time point.

Next, description will be made with regard to a case where machine learning is used in light of the considerations discussed in the comparative example. Processing using machine learning is as follow:
(Preparation)
1: A plurality of pieces of normal data are obtained as reference data.
2: Sample mean μ and sample covariance matrix Σ are calculated based on the reference data group.
3: Data abnormality determination threshold $a_{th}$ is calculated based on the false alarm rate α and the chi-squared distribution.

(Data Abnormality Determination)
1: Observation data is obtained.
2: Mahalanobis distance a(x') is calculated for the observation data.
3: When the Mahalanobis distance a(x') is in excess of the data abnormality determination threshold $a_{th}$, the observation data is determined as having a data abnormality.

Thus, the method using machine learning perform calculations of the sample mean μ, the sample covariance matrix Σ, and the Mahalanobis distance a(x'), instead of calculating a normal distribution. These calculations are performed by four basic arithmetic operations, which are simple operations. Therefore, even if these calculations are successively performed at short intervals during operation of the motor-driven mechanism 1 continuing over a long period of time, the calculations would not involve a large amount of processing load. Additionally, even though the equation for calculating the data abnormality determination threshold $a_{th}$ is apparently complicated, the data abnormality determination threshold $a_{th}$ is a time-independent constant and, therefore, needs to be calculated only once in advance.

5: Determination as to Occurrence of Motion Abnormality

Figure 4:
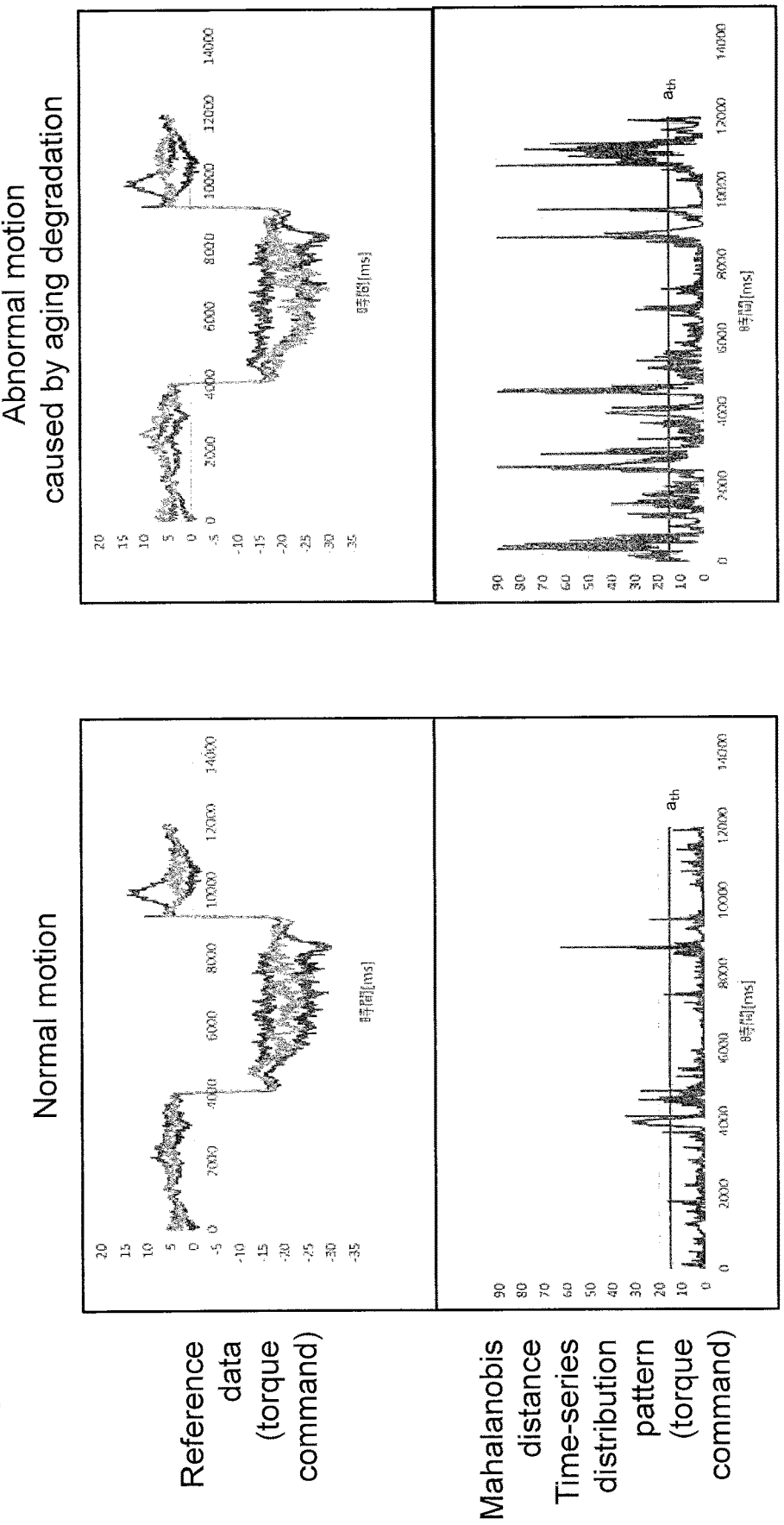
FIG. 4 illustrates: an example of reference data and an example of Mahalanobis distance time-series distribution pattern in a motion normality; and an example of reference data and an example of Mahalanobis distance time-series distribution pattern in a motion abnormality.

The above-described data abnormality determination ensures determination as to, in binary form, presence or absence of an abnormal state in the time-series detection data (that is, whether the time-series detection data is abnormal or normal) when the time-series detection data is seen at the point of time at which the data is obtained. Even if, however, a data abnormality has been identified once, this should not lead to the determination that a motion abnormality or an equipment abnormality is occurring in the mechanical system as a whole, as described later by referring to an experiment. Also, when a data abnormality has occurred a plurality of times, it is possible to estimate content of a motion abnormality directly based on how the data abnormality occurred. This embodiment assumes that the data abnormality frequency gradually increases as aging degradation develops. Under this assumption, when the data abnormality frequency has exceeded a predetermined value, this embodiment determines that the motor-driven mechanism 1 and the motor control apparatus have an equipment abnormality of the kind associated with aging degradation and that the motor 12 has a motion abnormality caused by the equipment abnormality, as illustrated in FIG. 4.

6: Specific Control Flow

Figure 5:
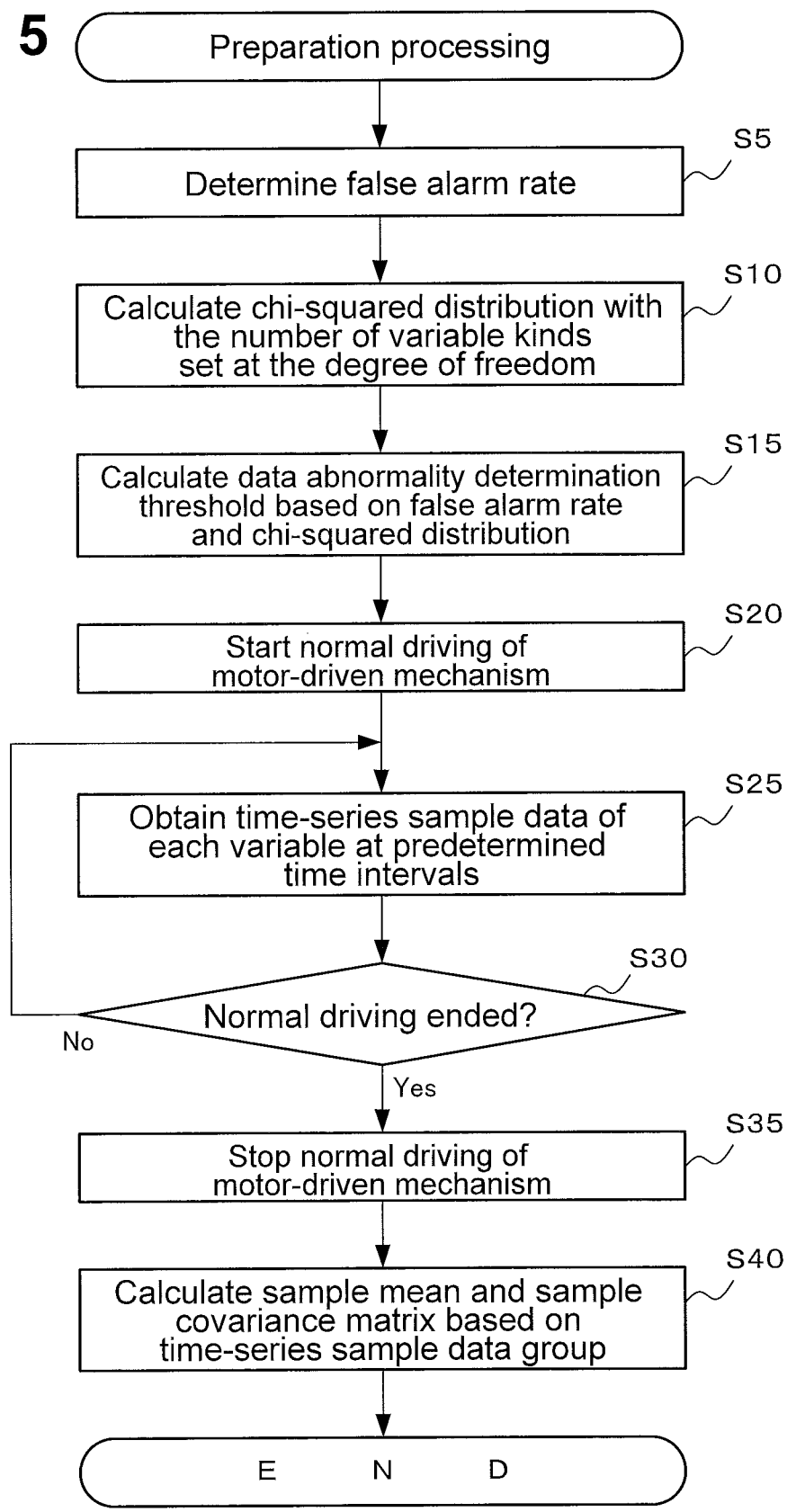
FIG. 5 is a flowchart of a control procedure for preparation processing performed by CPU of an edge server.

Detailed description will be made below with regard to an example specific control flow of a determination as to occurrence of a motion abnormality caused by an equipment abnormality of the kind associated with the above-described aging degradation. First, FIG. 5 is a flowchart of a control procedure for preparation processing corresponding to the above-described Preparation in a case where machine learning is used in a data abnormality determination. This flowchart is performed by CPU (which includes circuitry) of the edge server 4 illustrated in FIG. 1 while the motor-driven mechanism 1 is in normal driving, which is a driving state in which it is certain that substantially no data abnormality occurs. A possible example of the normal driving is that after the motor-driven mechanism 1 has been assembled and produced, the motor-driven mechanism 1 is driven in a sufficiently adjusted state and in a state (of initial operation or test operation) in which it is certain that the motor-driven mechanism 1 operates approximately as designed.

First, at step S5, the CPU of the edge server 4 determines false alarm rate α. The determination may be made arbitrarily by a user's input, or may be made on a value calculated based on a preset value or calculated by a predetermined method.

Next, at step S10, the CPU of the edge server 4 calculates a chi-squared distribution with the number of variable kinds set at M degree of freedom. In this embodiment, two kinds of time-series detection data, namely, torque command and output speed, are obtained for a single motor 12. Therefore, the degree of freedom M=2.

Next, at step S15, the CPU of the edge server 4 calculates a data abnormality determination threshold $a_{th}$ based on the false alarm rate α and the chi-squared distribution.

Next, at step S20, the CPU of the edge server 4 starts normal driving of the motor-driven mechanism 1 by performing motion control and motor driving control via the upper-level control apparatus 3 and the servo amplifier 2.

Next, at step S25, the CPU of the edge server 4 obtains, from the servo amplifier 2, time-series reference data of each of the variables (torque command and output speed for each axis) at predetermined time intervals, such as in every system cycle.

Next, at step S30, the CPU of the edge server 4 makes a determination as to whether the normal driving has ended. If the normal driving is not ended yet, the determination is not met, and the procedure returns to step S25 so that the same processing is performed again.

If, in contrast, the normal driving is not ended, the determination is met, and the procedure proceeds to step S35.

At step S35, the CPU of the edge server 4 stops the normal driving of the motor-driven mechanism 1.

Next, at step S40, the CPU of the edge server 4 calculates a sample mean μ and a sample covariance matrix Σ based on the time-series reference data group obtained at step S25, thus ending this flow of processing.

Through this flow of preparation processing, the preparation processing of machine learning (Steps 1 to 4), which involves a large amount of load of calculation processing, is performed in advance by the edge server 4, which has a comparatively high level of CPU power. This reduces burden on the resources of the abnormality determination system 100 as a whole.

Figure 6:
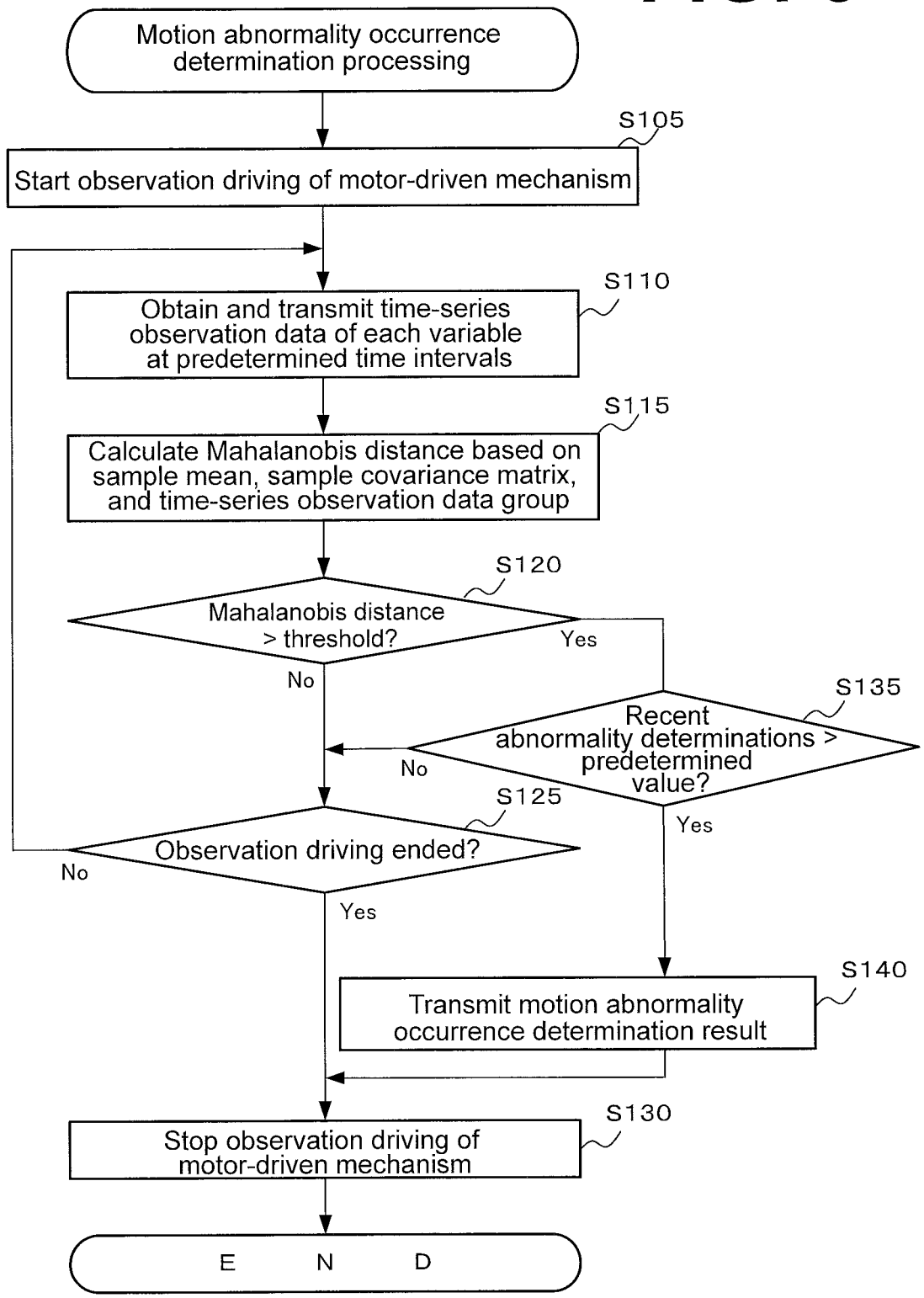
FIG. 6 is a flowchart of a control procedure for motion abnormality occurrence determination processing performed by CPU of a servo amplifier.

Next, FIG. 6 is a flowchart of a control procedure for motion abnormality occurrence determination processing, which includes data abnormality determination and motion abnormality determination. This flowchart is performed by CPU of the servo amplifier 2 illustrated in FIG. 1 while the motor-driven mechanism 1 is in observation driving, which is a driving state in which a data abnormality may occur. A possible example of the observation driving is driving in a state (of practical operation) in which the motor-driven mechanism 1 has been in operation for a sufficiently long period of time.

First, at step S105, the CPU of the servo amplifier 2 starts observation driving of the motor-driven mechanism 1 by performing motion control and motor driving control.

Next, at step S110, the CPU of the servo amplifier 2 obtains time-series observation data of each of the variables (torque command and output speed for each axis) at predetermined time intervals, such as in every system cycle, and transmits the time-series observation data to the edge server 4.

Next, at step S115, the CPU of the servo amplifier 2 calculates a Mahalanobis distance a(x') based on: the sample mean μ and the sample covariance matrix Σ that have been calculated in advance at step S40; and the time-series observation data group obtained at step S110.

Next, at step S120, the CPU of the servo amplifier 2 makes a determination as to whether the Mahalanobis distance a(x') calculated at step S115 is in excess of the data abnormality determination threshold $a_{th}$ (simply termed as "threshold" in the drawings) calculated in advance at step S15. In other words, the CPU of the servo amplifier 2 makes a determination as to whether the time-series observation data obtained at step S110 is in a data abnormality state. If the Mahalanobis distance a(x') is not in excess of the data abnormality determination threshold $a_{th}$, the determination is not met, and the procedure proceeds to step S125. In other words, the CPU of the servo amplifier 2 determines that no data abnormality is occurring.

At step S125, the CPU of the servo amplifier 2 makes a determination as to whether the observation driving has ended. If the observation driving is not ended yet, the determination is not met, and the procedure returns to step S110 so that the same processing is performed again.

If, in contrast, the observation driving has ended, the determination is met, and the procedure proceeds to step S130.

At step S130, the CPU of the servo amplifier 2 stops the observation driving of the motor-driven mechanism 1, thus ending this flow of processing.

If, in contrast, the determination made at step S120 is that the Mahalanobis distance a(x') is in excess of the data abnormality determination threshold $a_{th}$, the determination is met, and the procedure proceeds to step S135. In other words, the CPU of the servo amplifier 2 determines that a data abnormality is occurring.

At step S135, the CPU of the servo amplifier 2 makes a determination as to how many time-series observation data have been determined as abnormal in a predetermined number of data abnormality determinations that have been made most recently in the past (frequency of abnormalities determined as occurring in time-series observation data); and makes a determination as to whether the frequency is larger than a predetermined value (predetermined threshold). In other words, the CPU of the servo amplifier 2 makes a determination as to whether an equipment abnormality of the kind associated with aging degradation is occurring. If the frequency in the predetermined number of data abnormality determinations that have been made most recently is larger than the predetermined value, the determination is met, and the procedure proceeds to step S140. In other words, the CPU of the servo amplifier 2 determines that an equipment abnormality of the kind associated with aging degradation is occurring.

At step S140, the CPU of the servo amplifier 2 transmits, to the edge server 4, the determination that an equipment abnormality caused by aging degradation is occurring in the motor-driven mechanism 1 and the motor control apparatus and that an motion abnormality is occurring in the motor 12. Then, the procedure proceeds to step S130.

If, in contrast, the frequency in the predetermined number of data abnormality determinations that have been made most recently is equal to or less than the predetermined value, the determination is not met, and the procedure proceeds to step S125. In other words, the CPU of the servo amplifier 2 determines that no equipment abnormality caused by aging degradation is occurring.

Through this flow of motion abnormality occurrence determination processing, the determination processing (steps 5 and 6) and the motion abnormality occurrence determination processing of machine learning, which involve a comparatively small amount of load of calculation processing, is performed by the servo amplifier 2, which has a comparatively low level of CPU power. This reduces burden on the resources of the abnormality determination system 100 as a whole.

It is to be noted that the processings at steps S25 and S110 correspond to the time-series detection data obtaining circuit recited in the appended claims; the processings at steps S5, S10, S15, S40, S115, and S120 correspond to the data abnormality determination circuit recited in the appended claims; and the processing at step S135 corresponds to the motion abnormality occurrence determination circuit recited in the appended claims. It is also to be noted that the processing at step S5 corresponds to the false alarm rate determination circuit recited in the appended claims; the processing at step S10 corresponds to the chi-squared distribution calculation circuit recited in the appended claims; the processing at step S15 corresponds to the threshold calculation circuit recited in the appended claims; the processing at step S40 corresponds to the sample mean calculator and the sample covariance matrix calculation circuit recited in the appended claims; the processing at step S115 corresponds to the Mahalanobis distance calculation circuit recited in the appended claims; and the processing at step S120 corresponds to the determination circuit recited in the appended claims.

7: Determination as to Motion Abnormality Kind

As described above, the edge server 4 successively receives time-series detection data from the servo amplifier 2 and records time-series detection data, even during observation driving. When a motion abnormality has occurred, the edge server 4 receives, from the servo amplifier 2, a determination regarding the motion abnormality. Also, while reference data is necessary for a data abnormality determination, the edge server 4 itself has already prepared the reference data during the preparation processing for normal driving. This enables the edge server 4 itself to, upon receipt of a motion abnormality occurrence determination from the servo amplifier 2, make a determination as to a data abnormality based on the reference data and the time-series detection data, including calculation of the Mahalanobis distance. In the motion abnormality occurrence determination processing, however, the edge server 4 can do no further than to determine whether a motion abnormality has occurred in the motor 12.

In light of this, the edge server 4 also determines the kind of a motion abnormality based on a time-series distribution pattern of the Mahalanobis distance, as illustrated in the lower half area of FIG. 4. In this respect, a time-series distribution pattern of the Mahalanobis distance is prepared for each kind of time-series detection data, and does not show a time-series pattern of the time-series detection data itself or a distribution pattern in the frequency domain of the time-series detection data (neither of the patterns is illustrated). Rather, a time-series distribution pattern of the Mahalanobis distance is regarded as emphasizing, in particular, the degree or a characteristic of a motion abnormality in the motor 12. In light of this, in this embodiment, the edge server 4 makes a determination as the kind of a motion abnormality by performing pattern matching using machine learning with respect to a time-series distribution pattern of the Mahalanobis distance. A specific example of the pattern matching will be described below.

Figure 7:
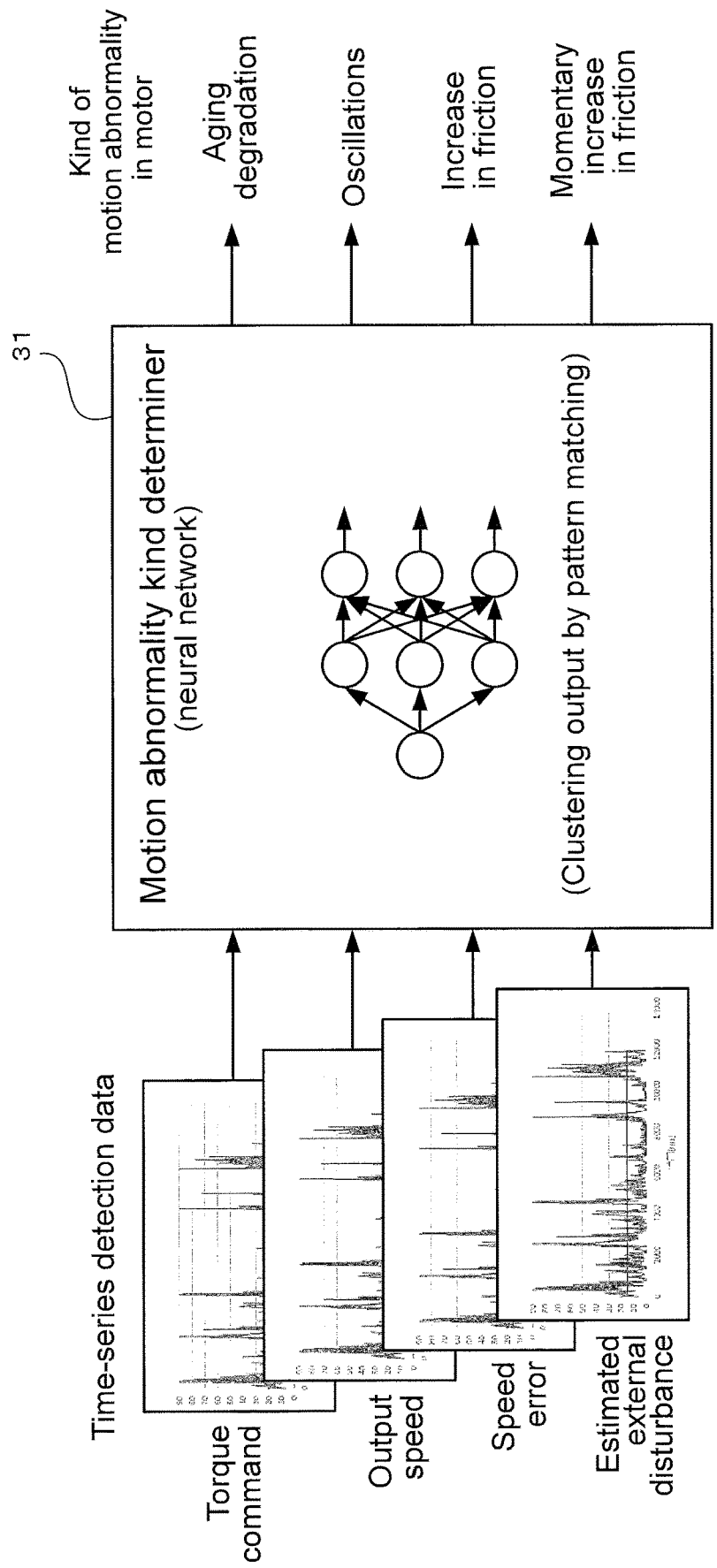
FIG. 7 illustrates an example of a neural network configuration model of a motion abnormality kind determiner.

FIG. 7 illustrates an example of a neural network configuration model of a motion abnormality kind determiner of the edge server 4. The motion abnormality kind determiner performs kind determination processing with respect to a motion abnormality. This motion abnormality kind determiner, 31, is designed and adjusted to perform clustering output of a motion abnormality kind of the motor 12 for a Mahalanobis distance time-series distribution pattern generated for each of the pieces of time-series detection data (torque command, output speed, speed error, and estimated external disturbance). The motion abnormality kind that is output is based on a learning content obtained in a machine learning process (deep learning). That is, the neural network of the motion abnormality kind determiner 31 has learned a feature quantity indicating a correlation between a waveform pattern included in the Mahalanobis distance time-series distribution pattern and the motion abnormality kind.

In the neural network having the above-described basic specifications, the layer closest to the input layer may be implemented by, for example, a convolutional neural network (not illustrated), which is a combination of a "convolutional layer" and a "pooling layer". This configuration ensures flexible pattern recognition. Another possible example is that the layer closest to the output layer is implemented by a fully connected layer (not illustrated), which is suitable for optimal value operations.

As a learning method of this neural net, it is possible to perform "supervised learning". When supervised learning is performed, training data that may be used is a combination of: input data of a Mahalanobis distance time-series distribution pattern generated based on time-series detection data of the motor 12 that is in a motion abnormality state of a known motion abnormality kind; and output data of the motion abnormality kind. Using a large number of pieces of such training data, learning is performed by "back-propagation processing (error back-propagation processing)", which adjusts weight coefficients of the edges connecting the nodes so as to establish a relationship between the input layer and the output layer of the neural network. It is to be noted that a learning method other than back-propagation may be used; in order to improve processing accuracy, it is possible to use a combination of various known learning methods, such as "stacked auto-encoder", "dropout, "noise addition", and "sparse regularization".

It is to be noted that the processing algorithm of the motion abnormality kind determiner 31 may be implemented by other than deep learning using the neural network illustrated, other possible examples including: other processing algorithms of machine learning (not illustrated) using a support vector machine or a Bayesian network; and other statistical methods. These motion abnormality kind determinations by machine learning and other methods can only be performed by the edge server 4, which has a comparatively high level of CPU power.

8: Estimation of Cause of Equipment Abnormality

Figure 8:
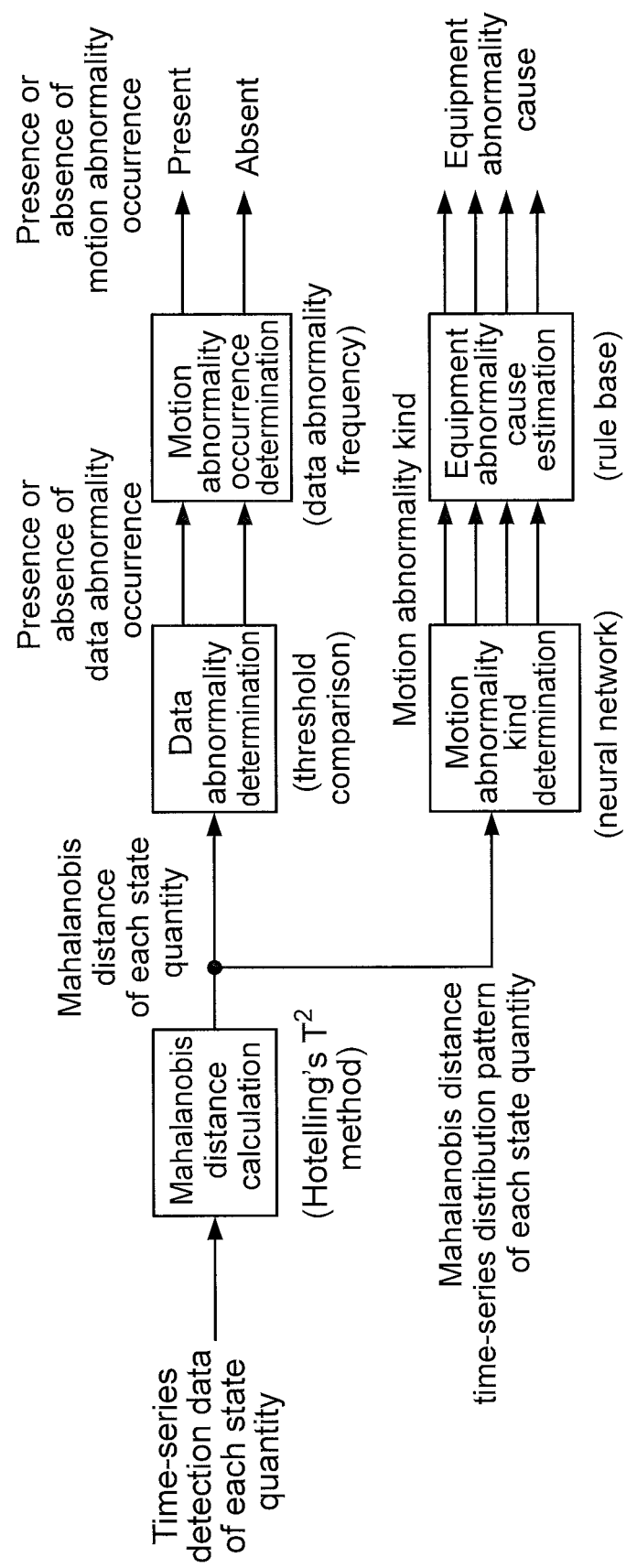
FIG. 8 is a schematic collectively illustrating relationships of how various kinds of information flow in various kinds of processing at the time of observation driving performed in an embodiment.

As described above, when a motion abnormality that has occurred in the motor 12 is, for example, the "increase in friction" kind of abnormality, such an estimation can be made that a particular equipment abnormality, such as degradation of the belt and grease deficiency on the bearing, has occurred in the motor-driven mechanism 1, which is a timing belt mechanism. Thus, there is in many cases a particular causal relationship between the kind of a motion abnormality in the motor 12 and the cause of an equipment abnormality occurring in the motor-driven mechanism 1 and the motor control apparatus. This causal relationship depends on mechanical and/or circuit-related configurations and specifications of the motor-driven mechanism 1 and the motor control apparatus. In light of this, in this embodiment, a predetermined relationship rule is used to establish a causal relationship between: the kind of a motion abnormality in the motor 12 attributed to mechanical and/or circuit-related configurations and specifications of the motor-driven mechanism 1; and the cause of an equipment abnormality in the motor-driven mechanism 1 and the motor control apparatus. Then, such causal relationships are stored as a database (not illustrated) in the edge server 4. This ensures that from a previously determined kind of a motion abnormality in the motor 12, the edge server 4 is able to estimate, based on the rule base, the cause of an equipment abnormality occurring in the motor-driven mechanism 1 and the motor control apparatus. It is to be noted that this processing of estimating the cause of an equipment abnormality performed by the edge server 4 corresponds to the equipment abnormality determiner and the equipment abnormality cause estimation circuit recited in the appended claims. FIG. 8 collectively illustrates relationships of how various kinds of information flow in various kinds of processing at the time of observation driving of the abnormality determination system 100, described earlier, according to this embodiment. It is to be noted that while the various kinds of processing illustrated can all be performed by the edge server 4, the Mahalanobis distance calculation, the data abnormality determination, and the motion abnormality occurrence determination, which are among the various kinds of processing, are performed by the servo amplifier 2 in this embodiment.

9: Advantageous Effects of this Embodiment

As has been described hereinbefore, the abnormality determination system 100 according to this embodiment includes: the motion abnormality occurrence determination processing and the motion abnormality kind determiner 31, which make a determination as to a motion abnormality in the motor 12 based on how time-series detection data determined as having a data abnormality was obtained; and the equipment abnormality determiner, which makes a determination as to an equipment abnormality in the motor-driven mechanism 1 and the motor control apparatus based on the determination made by the motion abnormality kind determiner 31. This ensures that an equipment abnormality in the motor-driven mechanism 1 and the motor control apparatus can be determined based on the determination as to the data abnormality or the determination as to the motion abnormality in the motor 12 such that the equipment abnormality is correlated with characteristics of these abnormalities. As a result, a specific content of an equipment abnormality in the mechanical system can be determined.

It is particularly to be noted that in this embodiment, the data abnormality determiner makes the determination using a Hotelling's $T^2$ method. This ensures that a data abnormality determination is made highly reliably by multivariate analysis.

It is particularly to be noted that in this embodiment, in the Hotelling's $T^2$ method, the data abnormality determiner calculates a sample mean $\mu$ and a sample covariance matrix $\Sigma$ based on time-series reference data obtained during normal driving. Also, the abnormality determination system 100 calculates a Mahalanobis distance $a(x')$ based on time-series observation data obtained during observation driving, together with the sample mean $\mu$ and the sample covariance matrix $\Sigma$. Then, the abnormality determination system 100 compares the Mahalanobis distance $a(x')$ with a data abnormality determination threshold $a_{th}$ to make a determination as to a data abnormality in the time-series observation data. This ensures that Hotelling's $T^2$ machine learning can be performed by "supervised learning", improving the reliability of data abnormality determination. It is possible to use machine learning by performing "unsupervised learning" such as clustering.

It is particularly to be noted that in this embodiment, the servo amplifier 2 performs motion abnormality occurrence determination processing of making a determination as to whether a motion abnormality is occurring. This ensures that the determination processing (steps 5 and 6) and the motion abnormality occurrence determination processing of machine learning, which involve a comparatively small amount of load of calculation processing, is performed by the servo amplifier 2, which has a comparatively low level of CPU power. This reduces burden on the resources of the abnormality determination system 100 as a whole.

It is particularly to be noted that in this embodiment, in the motion abnormality occurrence determination processing, the servo amplifier 2 makes the determination as to a motion abnormality based on a data abnormality frequency. This ensures that a motion abnormality caused by aging degradation is determined with high reliability. It is to be noted that the method of determining occurrence of a motion abnormality and an equipment abnormality will not be limited to use of data abnormality frequency. For example, it is possible to determine occurrence of a motion abnormality (equipment abnormality) based on various other occurrence forms such as occurrence time, occurrence frequency, and continuation period of a data abnormality. This ensures that determinations based on various motion abnormality kinds including aging degradation are made.

It is particularly to be noted that in this embodiment, the motion abnormality kind determiner 31 of the edge server 4 makes a determination as to the kind of a motion abnormality. This ensures that a specific kind of a motion abnormality occurring in the motor 12 is identified.

It is particularly to be noted that in this embodiment, based on a learning content obtained in a machine learning process, the motion abnormality kind determiner 31 of the edge server 4 makes a determination as to the kind of a motion abnormality using pattern matching performed with respect to a time-series distribution pattern of the Mahalanobis distance. This ensures that the kind of a motion abnormality is determined with high accuracy without a design using an artificial mathematical model. It is to be noted that in determining the kind of a motion abnormality, it is not necessary to rely upon Mahalanobis distance time-series distribution patterns corresponding to all the four pieces of time-series detection data illustrated in FIG. 7; instead, it is possible to use one or some (one to three) of the Mahalanobis distance time-series distribution patterns to perform pattern matching. It is also to be noted that the time-series pattern data of a state quantity input into the motion abnormality kind determiner 31 will not be limited to a Mahalanobis distance time-series distribution pattern, which is a time-series representation of lengths of Mahalanobis distances at time points of time-series detection data. For example, it is possible to make lengths of Mahalanobis distances at time points of time-series detection data unnecessary; instead, it is possible to use a time-series bit pattern showing whether the Mahalanobis distance at each time point is in excess of the data abnormality determination threshold $a_{th}$, that is, showing the presence and absence of a data abnormality in a time-series and binary form (not illustrated). In this case, although there is a possibility of degradation of the accuracy of determination as to motion abnormality kind, there is such an advantage that the configuration of the neural network of the motion abnormality kind determiner 31 is simplified.

It is particularly to be noted that in this embodiment, when the edge server 4 makes a determination as to an equipment abnormality, the edge server 4 estimates a cause of the equipment abnormality. This ensures that details of the cause of an equipment abnormality occurring in the motor-driven mechanism 1 are identified.

It is particularly to be noted that in this embodiment, when the edge server 4 makes the determination as to the cause of an equipment abnormality, the edge server 4 estimates the cause of the equipment abnormality according to a rule base that is based on a determination as to the kind of a motion abnormality. This ensures that the cause of an equipment abnormality is estimated based on a causal relationship between: the kind of a motion abnormality in the motor 12 attributed to the mechanical configuration of the motor-driven mechanism 1; and the kind of an equipment abnormality in the motor-driven mechanism 1 and the motor control apparatus.

It is to be noted that the CPU of the servo amplifier 2 and the CPU of the edge server 4 may not necessarily share the above-described processings in the manner described above, the processings including preparation processing, motion abnormality occurrence determination processing, data abnormality determination, motion abnormality kind determination, and equipment abnormality kind estimation. For example, the CPU of the servo amplifier 2, the CPU of the upper-level control apparatus 3, and the CPU of the edge server 4 may be integrated into any combination, and may share the processings in any other manner. A possible example, not illustrated, is that the servo amplifier 2 only obtains and transmits time-series detection data, and the edge server 4 performs data abnormality determination, motion abnormality occurrence determination, motion abnormality kind determination, and equipment abnormality kind determination.

10: Modifications

10-1: Estimation of Cause of Equipment Abnormality by Pattern Matching

Figure 9:
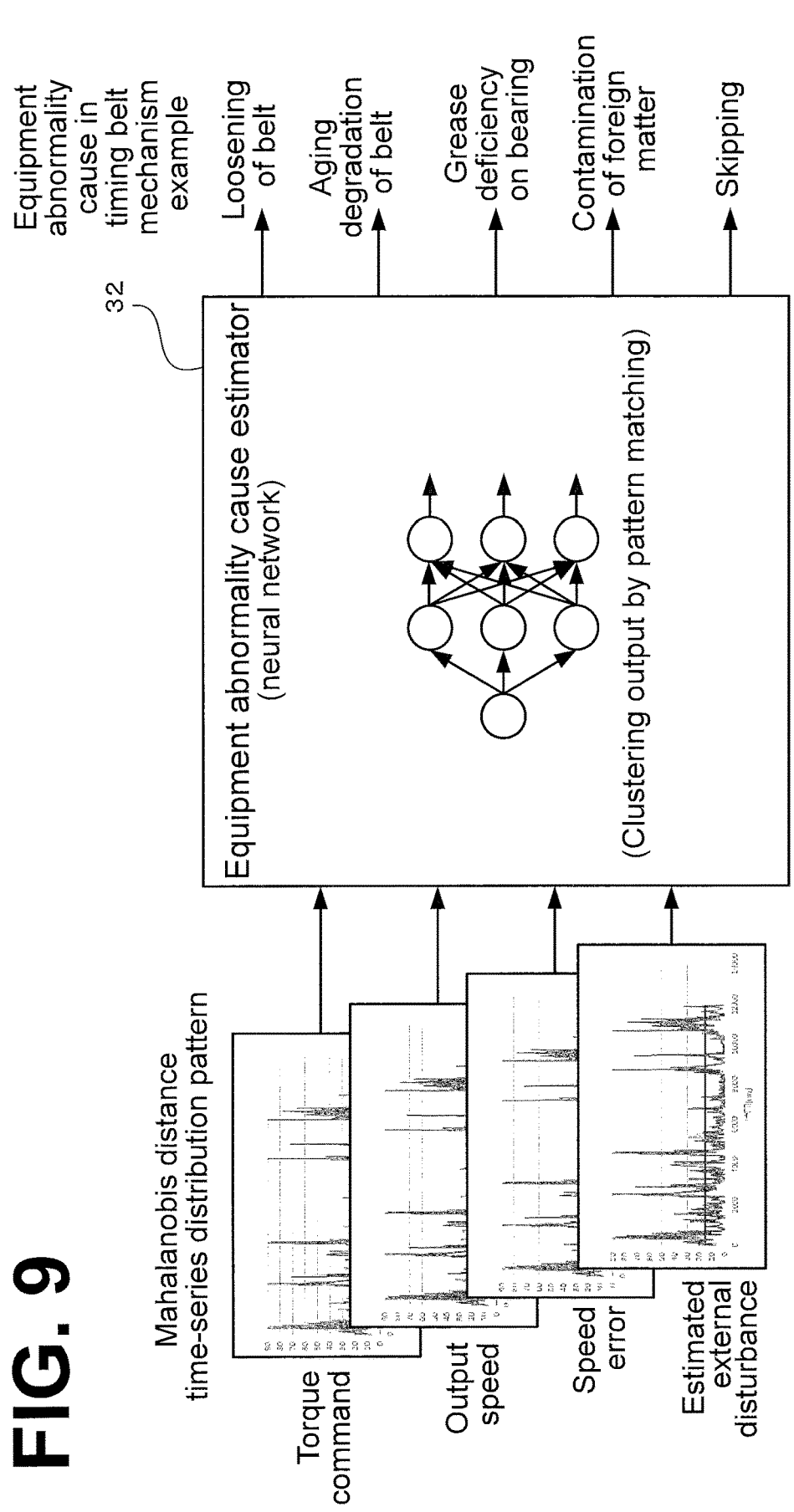
FIG. 9 illustrates an example of a neural network configuration model of an equipment abnormality cause estimator.

It is to be noted that the embodiment disclosed herein is not intended in a limiting sense; any modifications are possible without departing from the spirit and technical scope of the present disclosure. For example, while in the above-described embodiment the edge server 4 performs an equipment abnormality cause estimation according to a rule base, this configuration is not intended in a limiting sense. For example, in some cases, a time-series distribution pattern of the Mahalanobis distance emphasizes the level and/or characteristics of an equipment abnormality in the motor-driven mechanism 1 and the motor control apparatus. In light of this, as illustrated in FIG. 9, an equipment abnormality cause estimator 32, which is implemented by a neural network, may directly estimate the cause of the equipment abnormality (in the example illustrated, only an equipment abnormality in the timing belt mechanism is shown) by pattern matching using the Mahalanobis distance time-series distribution pattern of each piece of the time-series detection data. This eliminates the need for performing the determination as to the kind of a motion abnormality in the motor 12, ensuring that the cause of an equipment abnormality in the motor-driven mechanism 1 and the motor control apparatus is estimated with more ease.

10-2: Estimation of Position of Equipment Abnormality by Pattern Matching

Figure 10:
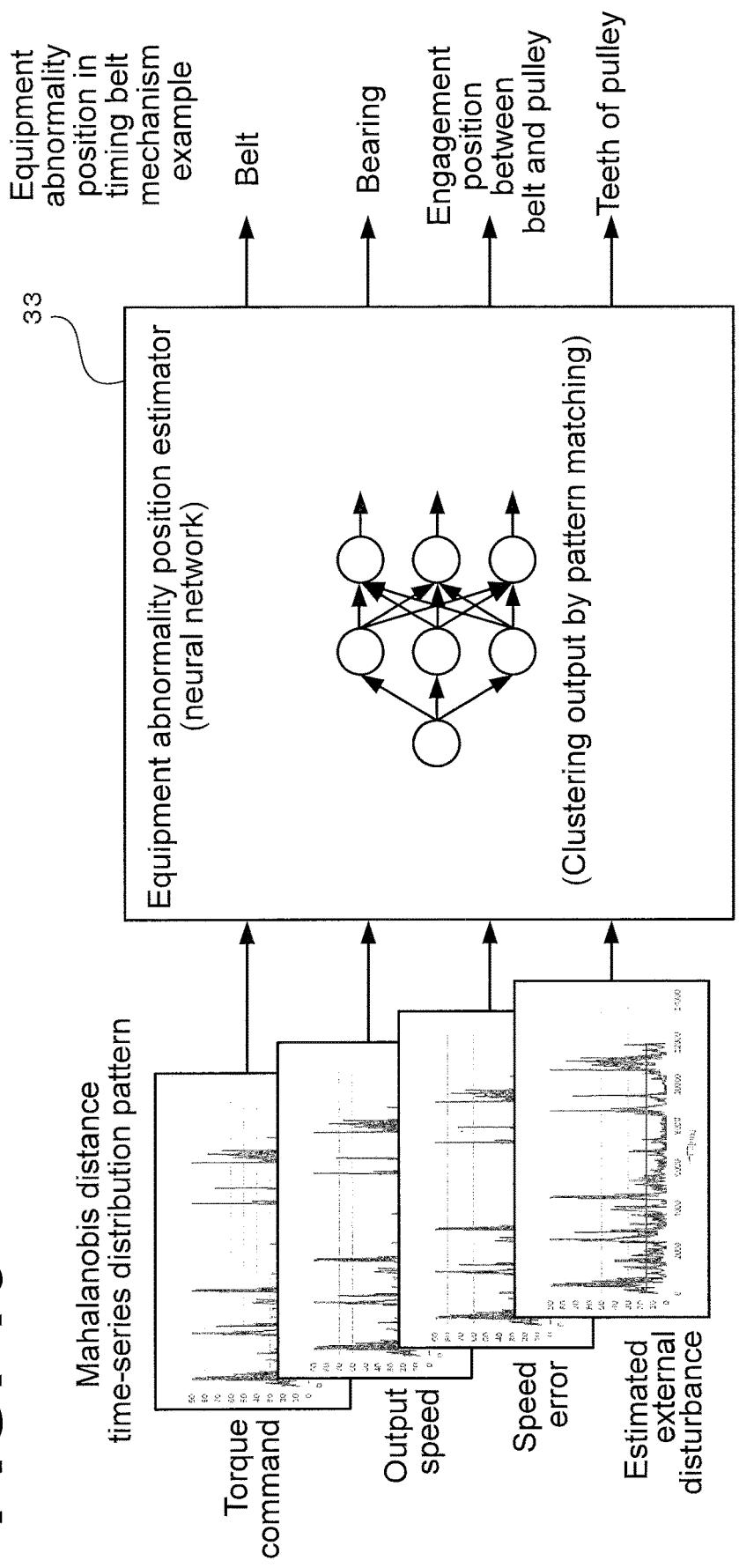
FIG. 10 illustrates an example of a neural network configuration model of an equipment abnormality position estimator.

There is also such a case where a time-series distribution pattern of the Mahalanobis distance emphasizes characteristics associated with the occurrence position of an equipment abnormality in the motor-driven mechanism 1 and the motor control apparatus. In light of this, as illustrated in FIG. 10, an equipment abnormality position estimator 33, which is implemented by a neural network, may directly estimate the occurrence position of the equipment abnormality (in the example illustrated, only an equipment abnormality in the timing belt mechanism is shown) by pattern matching using the Mahalanobis distance time-series distribution pattern of each piece of the time-series detection data. This ensures that the occurrence position of an equipment abnormality in the motor-driven mechanism 1 and the motor control apparatus is estimated with more ease.

10-3: Cause Estimation and Position Estimation of Equipment Abnormality Using Equipment Characteristic Estimated Value In the above-described embodiment and modifications, the cause estimation and position estimation of an equipment abnormality have been described as: estimations from content of a motion abnormality kind determination according to a rule base; or estimations by pattern matching using the Mahalanobis distance time-series distribution pattern of each piece of the time-series detection data. It is also possible, however, to perform cause estimation and position estimation of an equipment abnormality by other than the above-described methods; for example, it is possible to estimate a mechanical characteristic value of the motor-driven mechanism 1 based on each piece of the time-series detection data, which is a state quantity, and perform the cause estimation and the position estimation based on the characteristic value.

Figure 11:
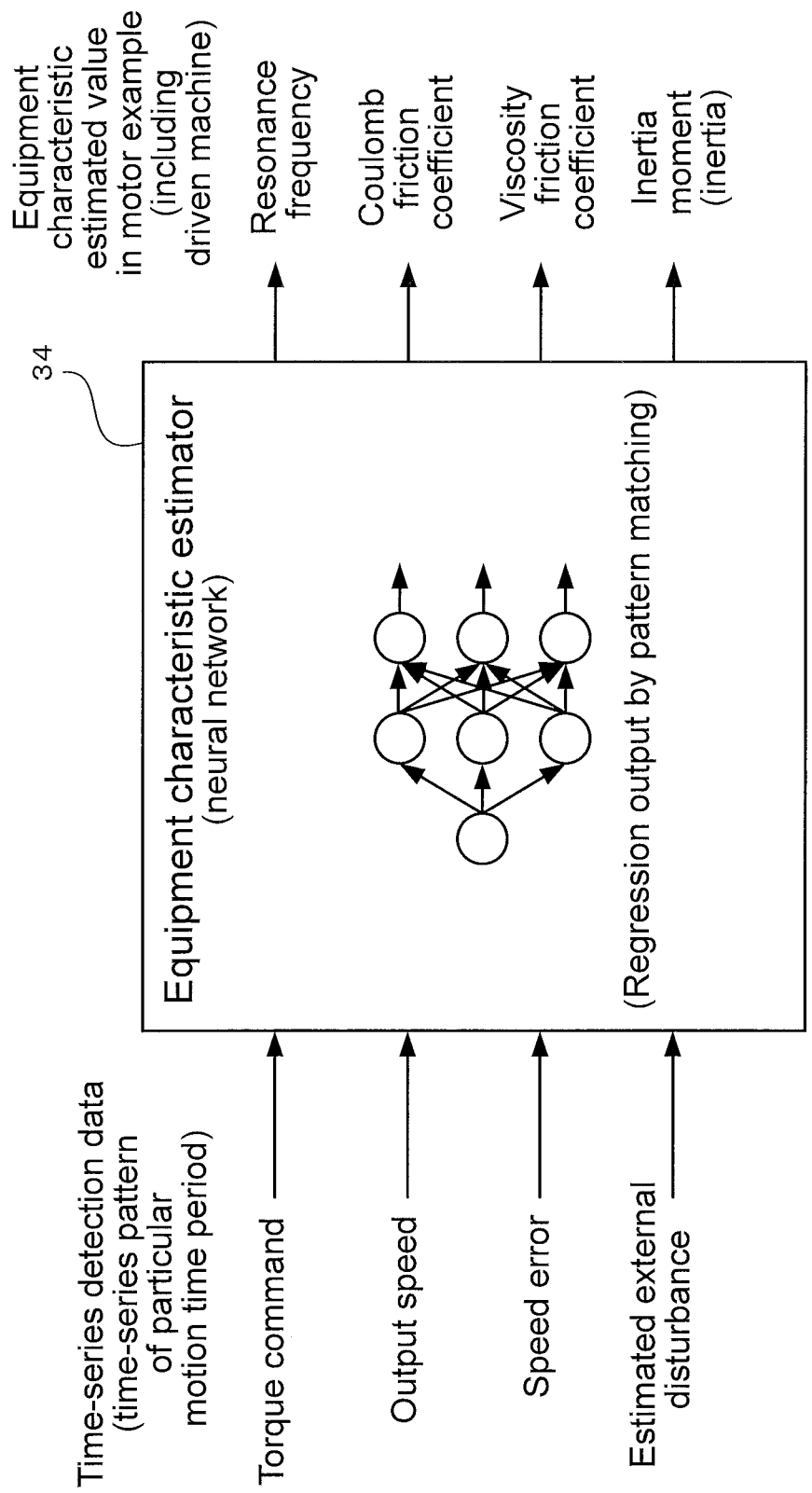
FIG. 11 illustrates an example of a neural network configuration model of an equipment characteristic estimator.

Specifically, equipment characteristic value examples include: various friction coefficients such as resonance frequency, coulomb friction coefficient, and viscosity friction coefficient; and inertia moment (inertia). These examples may be calculated as estimated values by an operation formula using a predetermined known mathematical model or by an analysis method based on the time-series detection data detected at the servo amplifier 2, namely, torque command, output position, output speed, estimated external disturbance, and speed error. It is to be noted that an example of the analysis method is a mechanical analysis that includes a frequency analysis using, for example, FFT. Alternatively, as illustrated in FIG. 11, an equipment characteristic estimator 34, which is implemented by a neural network, may directly estimate, by regression output (multi-valued output), an equipment characteristic estimated value of the motor-driven mechanism 1 (in the example illustrated, only an equipment characteristic value of the motor (including the driven machine) is shown) as of a present point of time by pattern matching using each piece of the time-series detection data.

In some cases, a combination of these various equipment characteristic estimated values that have been estimated emphasize characteristics associated with the cause and/or the occurrence position of an equipment abnormality in the motor-driven mechanism 1 at the present point of time.

Figure 12:
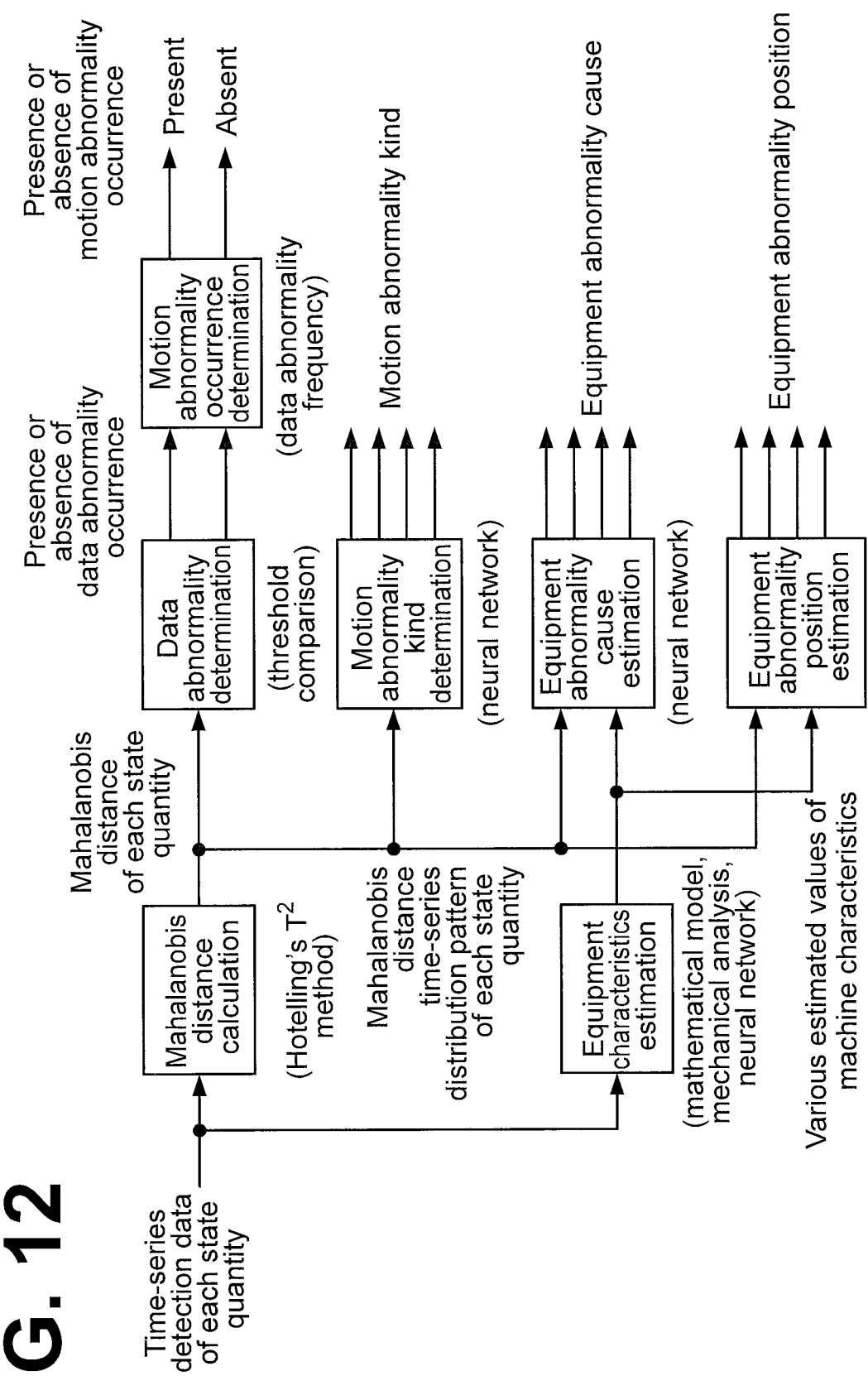
FIG. 12 is a schematic collectively illustrating relationships of how various kinds of information flow in various kinds of processing at the time of observation driving performed in modifications.

Thus, it is possible to: input the above-described various equipment characteristic estimated values, instead of various Mahalanobis distance time-series distribution patterns, into the equipment abnormality cause estimator 32 or the equipment abnormality position estimator 33 so as to cause the estimator to estimate the cause or the occurrence position of the equipment abnormality (not illustrated); or input both the Mahalanobis distance time-series distribution patterns and the equipment characteristic estimated values into the estimator so as to cause the estimator to estimate the cause or the occurrence position of the equipment abnormality with higher estimation accuracy (see FIG. 12, described later).

FIG. 12 collectively illustrates relationships of how various kinds of information flow in various kinds of processing at the time of observation driving in the above-described modifications. It is to be noted that while the various kinds of processing illustrated can all be performed by the edge server 4, the Mahalanobis distance calculation, the data abnormality determination, and the motion abnormality occurrence determination, which are among the various kinds of processing, are performed by the servo amplifier 2.

It is also to be noted that the motor 12 of the motor-driven mechanism 1 may be a linear motor, which is not illustrated, that makes linear motions. In this case, a linear scale is used instead of the encoder 11, and a thrust command, instead of a torque command, is obtained as time-series detection data.

As used herein, the term "perpendicular" means substantially or approximately perpendicular within some design tolerance or manufacturing tolerance, as well as precisely perpendicular. As used herein, the term "parallel" means substantially or approximately parallel within some design tolerance or manufacturing tolerance, as well as precisely parallel. As used herein, the term "planar" means substantially or approximately planar within some design tolerance or manufacturing tolerance, as well as precisely planar.

Also, when the terms "identical", "same", "equivalent", and "different" are used in the context of dimensions, magnitudes, sizes, or positions, these terms may not necessarily mean "identical", "same", "equivalent", and "different", respectively, in a strict sense. Specifically, the terms "identical", "same", "equivalent", and "different" are intended to mean "substantially or approximately identical", "substantially or approximately same", "substantially or approximately equivalent", and "substantially or approximately different", respectively, within some design tolerance or manufacturing tolerance.

Otherwise, the above-described embodiments and modifications may be combined in any manner deemed suitable.

Obviously, numerous modifications and variations of the present disclosure are possible in light of the above teachings. It is therefore to be understood that within the scope of the appended claims, the present disclosure may be practiced otherwise than as specifically described herein.

What is claimed as new and desired to be secured by Letters Patent of the United States is:

1. An abnormality determination system comprising:
a state quantity obtaining circuit configured to obtain a state quantity associated with a mechanical system; and
an abnormality determination circuit configured to, according to a learning content obtained in a machine learning process and based on the state quantity, determine as to at least one of an occurrence of an abnormality in the mechanical system, an occurrence location where the abnormality occurs, and a cause of the abnormality,
wherein the mechanical system comprises
a motor,
a motor control apparatus configured to control the motor, and
a motor-driven mechanism configured to be driven by the motor,
wherein the state quantity obtaining circuit comprises a time-series detection data obtaining circuit configured to obtain, as the state quantity, time-series detection data associated with input and output of the motor while the motor is driven, and
wherein the abnormality determination circuit comprises an equipment characteristic estimation circuit configured to estimate an equipment characteristic estimated value of the mechanical system based on the time-series detection data.

2. The abnormality determination system according to claim 1, wherein the abnormality determination circuit comprises
a data abnormality determination circuit configured to make a determination as to whether the time-series detection data has a data abnormality, and
an equipment abnormality determination circuit configured to, based on the determination made by the data abnormality determination circuit, make a determination as to whether at least one of the motor, the motor control apparatus, and the motor-driven mechanism has an equipment abnormality.

3. The abnormality determination system according to claim 2, wherein the data abnormality determination circuit is configured to make the determination according to a Hotelling's $T^2$ method.

4. The abnormality determination system according to claim 3,
wherein the data abnormality determination circuit comprises
a false alarm rate determination circuit configured to determine a false alarm rate,
a chi-squared distribution calculation circuit configured to calculate a chi-squared distribution,
a threshold calculation circuit configured to calculate a data abnormality determination threshold based on the false alarm rate and the chi-squared distribution,
a sample mean calculation circuit configured to calculate a sample mean based on the time-series detection data,
a sample covariance matrix calculation circuit configured to calculate a sample covariance matrix based on the time-series detection data,
a Mahalanobis distance calculation circuit configured to calculate a Mahalanobis distance based on the sample mean, the sample covariance matrix, and the time-series detection data, and
a determination circuit configured to compare the data abnormality determination threshold and the Mahalanobis distance with each other to make a determination as to whether the time-series detection data has a data abnormality,
wherein the sample mean calculation circuit and the sample covariance matrix calculation circuit are configured to use time-series reference data obtained during a normal driving of the motor-driven mechanism,
wherein the Mahalanobis distance calculation circuit is configured to use time-series observation data obtained during an observation driving of the motor-driven mechanism, and wherein the determination circuit is configured to make a determination as to whether the time-series observation data has the data abnormality.

5. The abnormality determination system according to claim 2, wherein the equipment abnormality determination circuit comprises an equipment abnormality cause estimation circuit configured to estimate a cause of the equipment abnormality.

6. The abnormality determination system according to claim 5, wherein the equipment abnormality cause estimation circuit is configured to, based on the learning content obtained in the machine learning process, estimate the cause of the equipment abnormality according to at least one of the equipment characteristic estimated value and pattern matching which is performed with respect to a time-series distribution pattern of the Mahalanobis distance.

7. The abnormality determination system according to claim 2, wherein the equipment abnormality determination circuit comprises a motion abnormality determination circuit configured to make a determination as to whether the motor has a motion abnormality based on how the time-series detection data determined as having the data abnormality was obtained.

8. The abnormality determination system according to claim 7, wherein the motion abnormality determination circuit comprises a motion abnormality occurrence determination circuit configured to make a determination as to whether the motion abnormality is occurring or not occurring.

9. The abnormality determination system according to claim 8, wherein the motion abnormality occurrence determination circuit is configured to, based on a data abnormality frequency, make the determination as to whether the motion abnormality is occurring or not occurring.

10. The abnormality determination system according to claim 7, wherein the motion abnormality determination circuit comprises a motion abnormality kind determination circuit configured to make a determination as to a kind of the motion abnormality.

11. The abnormality determination system according to claim 10, wherein the motion abnormality kind determination circuit is configured to, based on the learning content obtained in the machine learning process, make the determination as to the kind of the motion abnormality using pattern matching performed with respect to a time-series distribution pattern of the Mahalanobis distance.

12. The abnormality determination system according to claim 10, wherein the equipment abnormality cause estimation circuit is configured to estimate the cause of the equipment abnormality based on the determination made by the motion abnormality kind determination circuit.

13. The abnormality determination system according to claim 2, wherein the equipment abnormality determination circuit comprises an equipment abnormality position estimation circuit configured to estimate an occurrence location where the equipment abnormality occurs.

14. The abnormality determination system according to claim 13, wherein the equipment abnormality position estimation circuit is configured to, based on the learning content obtained in the machine learning process, estimate the occurrence location of the equipment abnormality according to at least one of the equipment characteristic estimated value and the pattern matching which is performed with respect to the time-series distribution pattern of the Mahalanobis distance.

15. The abnormality determination system according to claim 1, wherein the abnormality determination circuit comprises
a data abnormality determination circuit configured to make a determination as to whether the time-series detection data has a data abnormality, and
an equipment abnormality determination circuit configured to, based on the determination made by the data abnormality determination circuit, make a determination as to whether at least one of the motor, the motor control apparatus, and the motor-driven mechanism has an equipment abnormality.

16. The abnormality determination system according to claim 15, wherein the data abnormality determination circuit is configured to make the determination according to a Hotelling's $T^2$ method.

17. A motor control apparatus comprising:
a circuit configured to supply electric power to a motor to drive a motor-driven mechanism;
a state quantity obtaining circuit configured to obtain a state quantity associated with at least one of the motor, the motor-driven mechanism, and the motor control apparatus; and
an abnormality determination circuit configured to, according to a learning content obtained in a machine learning process and based on the state quantity, determine whether at least one of the motor, the motor-driven mechanism, and the motor control apparatus has an abnormality
wherein the state quantity obtaining circuit comprises a time-series detection data obtaining circuit configured to obtain, as the state quantity, time-series detection data associated with input and output of the motor while the motor is driven, and
wherein the abnormality determination circuit comprises an equipment characteristic estimation circuit configured to estimate an equipment characteristic estimated value of the at least one of the motor, the motor-driven mechanism, and the motor control apparatus based on the time-series detection data.

18. An abnormality determination apparatus comprising:
a state quantity obtaining circuit configured to obtain a state quantity associated with a mechanical system; and
an abnormality determination circuit configured to, according to a learning content obtained in a machine learning process and based on the state quantity, determine as to at least one of an occurrence of an abnormality in the mechanical system, an occurrence location where the abnormality occurs, and a cause of the abnormality,
wherein the mechanical system comprises
a motor,
a motor control apparatus configured to control the motor, and
a motor-driven mechanism configured to be driven by the motor,
wherein the state quantity obtaining circuit comprises a time-series detection data obtaining circuit configured to obtain, as the state quantity, time-series detection data associated with input and output of the motor while the motor is driven, and
wherein the abnormality determination circuit comprises an equipment characteristic estimation circuit configured to estimate an equipment characteristic estimated value of the mechanical system based on the time-series detection data.

* * * * *